(12) United States Patent
Gibbs

(10) Patent No.: US 9,570,080 B2
(45) Date of Patent: *Feb. 14, 2017

(54) APPARATUS AND METHOD FOR ENCODING A MULTI-CHANNEL AUDIO SIGNAL

(71) Applicant: MOTOROLA MOBILITY LLC, Libertyville, IL (US)

(72) Inventor: Jonathan A Gibbs, Hampshire (GB)

(73) Assignee: Google Inc., Mountain View, CA (US)

( * ) Notice: Subject to any disclaimer, the term of this patent is extended or adjusted under 35 U.S.C. 154(b) by 315 days.

This patent is subject to a terminal disclaimer.

(21) Appl. No.: 13/920,549

(22) Filed: Jun. 18, 2013

(65) Prior Publication Data

US 2013/0282384 A1    Oct. 24, 2013

Related U.S. Application Data

(63) Continuation of application No. 12/679,121, filed as application No. PCT/US2008/075703 on Sep. 9, 2008, now Pat. No. 8,577,045.

(30) Foreign Application Priority Data

Sep. 25, 2007 (GB) .................................. 0718682.8

(51) Int. Cl.
*G10L 19/00* (2013.01)
*G10L 19/008* (2013.01)
(Continued)

(52) U.S. Cl.
CPC ............. *G10L 19/00* (2013.01); *G10L 19/008* (2013.01); *G10L 19/032* (2013.01); *G10L 19/06* (2013.01);
(Continued)

(58) Field of Classification Search
CPC ........ G10L 19/008; G10L 19/02; G10L 19/04; H04L 1/0014
(Continued)

(56) References Cited

U.S. PATENT DOCUMENTS 4,544,949 A    10/1985  Kurihara
5,434,948 A *   7/1995  Holt ..................... H04H 20/88
                                                  704/201

(Continued)

FOREIGN PATENT DOCUMENTS

CA    2707761 A1    8/2006
EP    1640971 A1    3/2006
(Continued)

OTHER PUBLICATIONS

Anguera, Robust speaker diarization for meetings, PhD, 2006.*
(Continued)

*Primary Examiner* — Davetta W Goins
*Assistant Examiner* — Kuassi Ganmavo
(74) *Attorney, Agent, or Firm* — Brake Hughes Bellermann LLP

(57) ABSTRACT

An encoding apparatus comprises a frame processor (105) which receives a multi channel audio signal comprising at least a first audio signal from a first microphone (101) and a second audio signal from a second microphone (103). An ITD processor 107 then determines an inter time difference between the first audio signal and the second audio signal and a set of delays (109, 111) generates a compensated multi channel audio signal from the multi channel audio signal by delaying at least one of the first and second audio signals in response to the inter time difference signal. A combiner (113) then generates a mono signal by combining channels of the compensated multi channel audio signal and a mono signal encoder (115) encodes the mono signal. The inter time (Continued)

difference may specifically be determined by an algorithm based on determining cross correlations between the first and second audio signals.

6 Claims, 5 Drawing Sheets

(51) Int. Cl.

| | |
|---|---|
| G10L 25/21 | (2013.01) |
| H03M 3/00 | (2006.01) |
| G10L 25/12 | (2013.01) |
| G10L 19/06 | (2013.01) |
| G10L 25/06 | (2013.01) |
| G10L 25/18 | (2013.01) |
| G10L 19/032 | (2013.01) |
| G10L 25/24 | (2013.01) |

(52) U.S. Cl.
CPC .............. *G10L 25/06* (2013.01); *G10L 25/12* (2013.01); *G10L 25/18* (2013.01); *G10L 25/21* (2013.01); *G10L 25/24* (2013.01); *H03M 3/466* (2013.01); *H04S 2400/01* (2013.01); *H04S 2420/03* (2013.01)

(58) Field of Classification Search
USPC ....... 381/1–2, 17–18, 23; 704/500, 201–204, 704/217–220
See application file for complete search history.

(56) References Cited

U.S. PATENT DOCUMENTS

| | | | |
|---|---|---|---|
| 5,511,093 A | 4/1996 | Edler et al. | |
| 5,844,947 A | 12/1998 | Cesari | |
| 5,844,974 A | 12/1998 | Ichikawa | |
| 5,917,863 A * | 6/1999 | Soichi | G11B 20/10009 360/29 |
| 6,236,731 B1 | 5/2001 | Brennan et al. | |
| 6,253,172 B1 * | 6/2001 | Ding et al. | 704/219 |
| 6,452,985 B1 * | 9/2002 | Hatakeyama | H03M 13/3961 375/262 |
| 6,973,184 B1 | 12/2005 | Shaffer et al. | |
| 6,988,064 B2 | 1/2006 | Ramabadran et al. | |
| 7,194,084 B2 | 3/2007 | Shaffer et al. | |
| 7,542,896 B2 * | 6/2009 | Schuijers et al. | 704/201 |
| 7,599,441 B2 * | 10/2009 | Ma | H04L 1/0041 375/261 |
| 7,653,155 B1 | 1/2010 | Ormesher et al. | |
| 7,653,533 B2 * | 1/2010 | Pang et al. | 704/201 |
| 7,797,162 B2 | 9/2010 | Yoshida et al. | |
| 8,112,286 B2 | 2/2012 | Goto et al. | |
| 8,194,872 B2 | 6/2012 | Buck et al. | |
| 8,271,275 B2 | 9/2012 | Goto et al. | |
| 2005/0053242 A1 | 3/2005 | Henn et al. | |
| 2006/0190247 A1 | 8/2006 | Lindblom | |
| 2006/0215849 A1 * | 9/2006 | Smaragdis | G01S 5/18 381/92 |
| 2007/0036360 A1 * | 2/2007 | Breebaart | G10L 19/008 381/23 |
| 2007/0094014 A1 | 4/2007 | Pang et al. | |
| 2007/0127729 A1 * | 6/2007 | Breebaart et al. | 381/18 |
| 2007/0165879 A1 | 7/2007 | Deng et al. | |
| 2007/0223708 A1 * | 9/2007 | Villemoes | H04S 3/004 381/17 |
| 2008/0019551 A1 * | 1/2008 | Watanabe | H04R 1/406 381/360 |

FOREIGN PATENT DOCUMENTS

| | | |
|---|---|---|
| JP | 20000044995 A | 1/2000 |
| WO | 03090206 A1 | 10/2003 |
| WO | 03090208 A1 | 10/2003 |

OTHER PUBLICATIONS

Zhang et al, A comparative study of time delay estimation techniques using microphone array,2005.*
Knapp et al, The Generalized Correlation for Estimation of Time Delay, IEEE, Aug. 1976.*
ETSI TS 126 290 V6.1.0 (Dec. 2004) Universal Mobile Telecommunications System (UMTS); Audio codec processing functions; Extended Adaptive Multi-Rate—Wideband (AMR-WB+) codec; Transcoding functions (3GPP TS 26.290 version 6.1.0 Release 6), 87 pages.
H. Purnhagen, "Low complexity Parametric Stereo Coding in MPEG-4" Proceedings 7th International Conference on Digital Audio Effects (DAFx'04), Naples, Italy, Oct. 5-8, 2004, pp. 163-168.
Samsudin, et al, "A Stereo to Mono Dowmixing Scheme for MPEG-4 Parametric Stereo Encoder", IEEE, 2006, pp. 529-532, vol. 142440469X.
Lindblom, J. et al.: "Flexible Sum-Difference Stereo Coding Based on Time-Aligned Signal Components," 2005 IEEE Workshop on Applications of Signal Processing to Audio and Acoustics, New Paltz, NY, pp. 255-258, Oct. 16-19, 2005.
Kaneda, Yutaka: "Sound Source Localization; Robot Audition System from the Signal Processing Point of View", SIG-Challenge-522-1, Japanese Society for Artificial Intelligence, 22nd Meeting of Special Interest Group on AI Challenges, Oct. 14, 2005. all pages.
Anguera Miro, Xavier: "Robust Speaker Diarization for Meetings", PhD Thesis, Speech Processing Group, Department of Signal Theory and Communications, Universitat Politecnica de Catalunya, Barcelona, Oct. 2006, all pages.
EP Office Action for corresponding EP Application No. 08799366.3, dated Nov. 24, 2015.
European Search Report for corresponding EP Application No. 08799366.3, dated Nov. 9, 2015.
Faller, Christof et al., "Improved Time Delay Analysis/Synthesis for Parametric Stereo Audio Coding," AES Convention 120; May 1, 2006, New York, XP040507647.

* cited by examiner

APPARATUS AND METHOD FOR ENCODING A MULTI-CHANNEL AUDIO SIGNAL

FIELD OF THE INVENTION

The invention relates to an apparatus and method for encoding a multi channel audio signal and in particular, but not exclusively, to down-mix a stereo speech signal to a mono signal for encoding with a mono encoder, such as a Code Excited Linear Prediction encoder.

BACKGROUND OF THE INVENTION

Efficient encoding of audio signals is critical for an increasing number of applications and systems. For example, mobile communications use efficient speech encoders to reduce the amount of data that needs to be transmitted over the air interface.

For example, the International Telecommunication Union (ITU) is standardizing a speech encoder known as the Embedded Variable Bit Rate Codec (EV-VBR) which can encode a speech signal at high quality with data rates ranging from 8 to 64 kbps. This encoder, as well as many other efficient speech encoders, uses Code Excited Linear Prediction (CELP) techniques to achieve the high compression ratio of the encoding process at the lower bit rates of operation.

In some applications, more than one audio signal may be captured and in particular a stereo signal may be recorded in audio systems using two microphones. For example, stereo recording may typically be used in audio and video conferencing as well as broadcasting applications.

In many multi channel encoding systems, and in particular in many multi channel speech encoding systems, the low level encoding is based on encoding of a single channel. In such systems, the multi channel signal may be converted to a mono signal for the lower layers of the coder to encode. The generation of this mono signal is referred to as down-mixing. Such down-mixing may be associated with parameters that describe aspects of the stereo signal relative to the mono signal. Specifically, the down mixing may generate inter-channel time difference (ITD) information which characterises the timing difference between the left and right channels. For example, if the two microphones are located at a distance from each other, the signal from a speaker located closer to one microphone than the other will reach the latter microphone with a delay relative to the first one. This ITD may be determined and may in the decoder be used to recreate the stereo signal from the mono signal. The ITD may significantly improve the quality of the recreated stereo perspective since ITD has been found to be the dominant perceptual influence on stereo location for frequencies below approximately 1 kHz. Thus, it is critical that ITD is also estimated.

Conventionally, the mono signal is generated by summing the stereo signals together. The mono signal is then encoded and transmitted to the decoder together with the ITD.

For example, the European Telecommunication Standards Institute has in their Technical Specification ETSI TS126290 "Extended Adaptive Multi-Rate—Wideband (AMR-WB+) Codec; Transcoding Functions" defined a stereo signal down-mixing where the mono signal is simply determined as the average of the left and right channels as follows.

$$x_{ML}(n) = 0.5(x_{LL}(n) + x_{RL}(n))$$

where $x_{ML}(n)$ represents the nth sample of the mono signal, $x_{LL}(n)$ represents the nth sample of the left channel signal and $x_{RL}(n)$ represents the the nth sample of the right channel signal.

Another example of a downmix is provided in H. Purnhagen, "Low Complexity Parametric Stereo Coding in MPEG-4", Proceedings 7$^{th}$ International Conference on Digital Audio Effects (DAFx'04), Naples, Italy, Oct. 5-8, 2004, pp 163-168. In this document, a down-mixing method is described which obtains an output mono signal as a weighted sum of the incoming channels on a band-by-band frequency basis using information obtained about the inter-channel intensity difference (IID). Specifically:

$$M[k,i] = g_l L[k,i] + g_r R[k,i]$$

where $M[k,i]$ represents the ith sample of the kth frequency bin of mono signal, $L[k,i]$ represents the ith sample of the kth frequency bin of the left channel signal and $R[k,i]$ represents the ith sample of the kth frequency bin of the right channel signal, $g_l$ is the left channel weight and $g_r$ is the right channel weight.

A characteristic of such approaches is that they either result in mono signals having a high reverberation time or else have high complexity and/or delay. For example, the AMR-WB+ method of down-mixing provides an output whose reverberation time is approximately that of the room plus the flight time between the two microphones. The downmix provided in Purnhagen is of high complexity and imposes a delay due to the frequency analysis and reconstruction.

However, many mono encoders provide the best results for signals with low reverberation times. For example, low bit rate CELP speech coders, and other encoders which employ pulse-based excitation to represent speech and audio signals, perform best when presented with signals having short reverberation times. Accordingly, the performance of the encoder and the quality of the resulting encoded signal tend to be suboptimal.

Hence, an improved system would be advantageous and in particular a system allowing increased flexibility, facilitated implementation, improved encoding quality, improved encoding efficiency, reduced delay and/or improved performance would be advantageous.

SUMMARY OF THE INVENTION

Accordingly, the Invention seeks to preferably mitigate, alleviate or eliminate one or more of the above mentioned disadvantages singly or in any combination.

According to an aspect of the invention there is provided an apparatus for encoding a multi channel audio signal, the apparatus comprising: a receiver for receiving the multi channel audio signal comprising at least a first audio signal from a first microphone and a second audio signal from a second microphone; a time difference unit for determining an inter time difference between the first audio signal and the second audio signal; a delay unit for generating a compensated multi channel audio signal from the multi channel audio signal by delaying at least one of the first audio signal and the second audio signal in response to the inter time difference signal; a mono unit for generating a mono signal by combining channels of the compensated multi channel audio signal; and a mono signal encoder for encoding the mono signal.

The invention may provide improved encoding of a multi channel audio signal. In particular, an improved quality for a given data rate may be achieved in many embodiments. The invention may provide improved mono encoding of a mono down mix signal from a stereo signal by reducing reverberation times of the mono down mix signal. The delay unit may delay either the first audio signal or the second audio signal depending on which microphone is closest to the (main) audio source. The inter time difference may be an indication of a time difference between corresponding audio components of the first and second audio signals originating from the same audio source. The unit for generating the mono signal may be arranged to sum the two channels of the combined multi channel audio signal which correspond to the first and second audio signals. In some embodiments, the summation may be a weighted summation.

According to an optional feature of the invention, the time difference unit is arranged to determine cross correlations between the first audio signal and the second audio signal for a plurality of time offsets, and to determine the inter time difference in response to the cross correlations.

The feature may allow an improved determination of the inter time difference. The feature may improve the quality of the encoded audio signal and/or may facilitate implementation and/or reduce complexity. In particular, the feature may allow improved stereo perception of a stereo signal rendered from the mono signal and the inter time difference. The cross correlations may indicate a probability of the inter time difference being equal to the time offset of the individual cross correlations.

According to another aspect of the invention there is provided a method of encoding a multi channel audio signal, the method comprising: receiving the multi channel audio signal comprising at least a first audio signal from a first microphone and a second audio signal from a second microphone; determining an inter time difference between the first audio signal and the second audio signal; generating a compensated multi channel audio signal from the multi channel audio signal by delaying at least one of the first audio signal and the second audio signal in response to the inter time difference signal; generating a mono signal by combining channels of the compensated multi channel audio signal; and encoding the mono signal in a mono signal encoder.

These and other aspects, features and advantages of the invention will be apparent from and elucidated with reference to the embodiment(s) described hereinafter.

BRIEF DESCRIPTION OF THE DRAWINGS

Embodiments of the invention will be described, by way of example only, with reference to the drawings, in which.

DETAILED DESCRIPTION OF SOME EMBODIMENTS OF THE INVENTION

The following description focuses on embodiments of the invention applicable to encoding of a multi channel audio signal using a mono encoder and in particular to encoding of a stereo speech signal using a mono CELP encoder.

Figure 1:
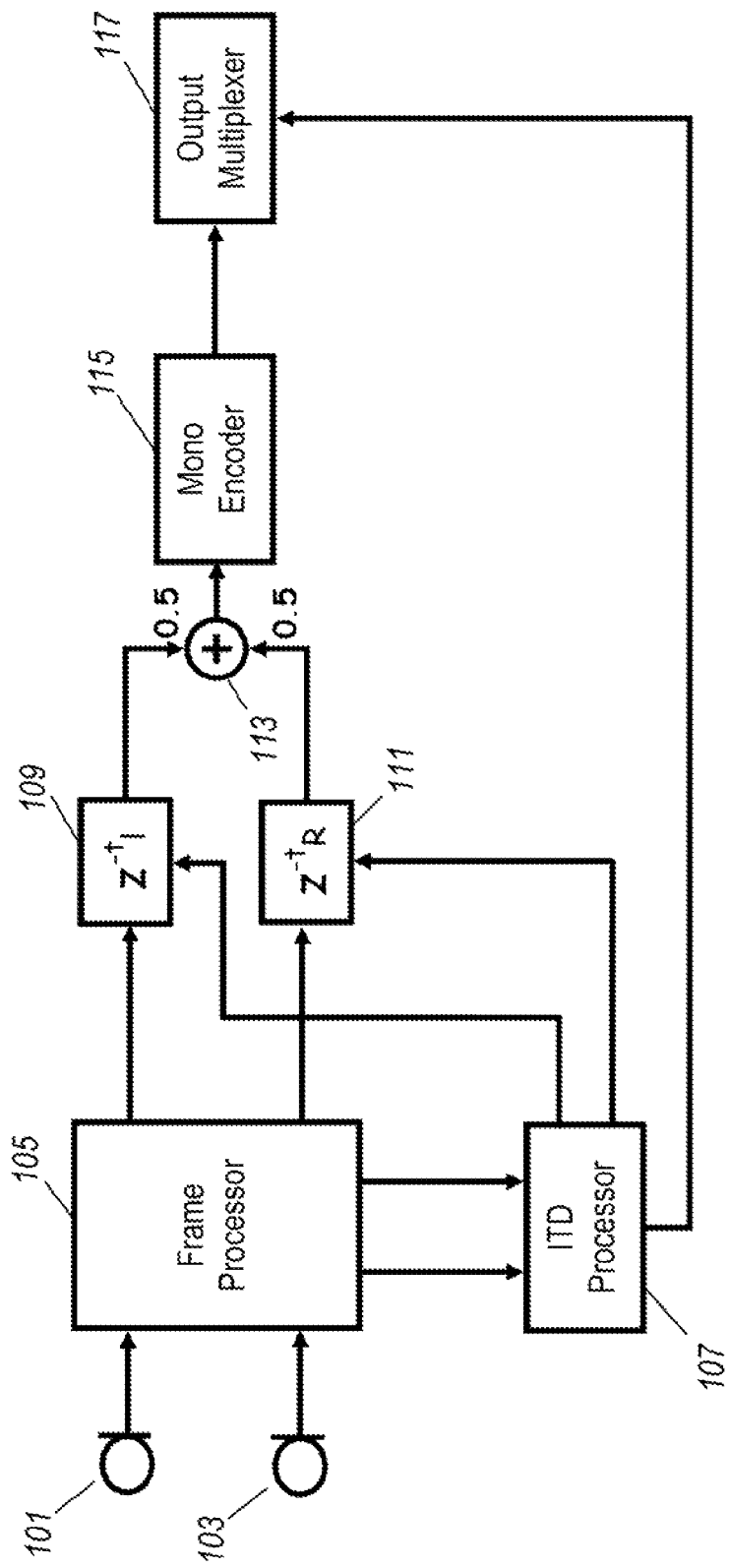
FIG. 1 illustrates an example of an apparatus for encoding a multi channel audio signal in accordance with some embodiments of the invention.

FIG. 1 illustrates an apparatus for encoding a multi channel audio signal in accordance with some embodiments of the invention. In the specific example, a stereo speech signal is down-mixed to a mono signal and encoded using a mono encoder.

The apparatus comprises two microphones 101, 103 which capture audio signals from the audio environment in which the two microphones are located. In the example, the two microphones are used to record speech signals in a room and are located with an internal distance of up to 3 meters. In the specific application, the microphones 101, 103 may for example be recording speech signals from a plurality of people in the room and the use of two microphones may provide better audio coverage of the room.

The microphones 101, 103 are coupled to a frame processor 105 which receives the first and second signals from the first and second microphones 101, 103 respectively. The frame processor divides the signals into sequential frames. In the specific example, the sample frequency is 16 ksamples/sec and the duration of a frame is 20 msec resulting in each frame comprising 320 samples. It should be noted that the frame processing need not result in an additional delay to the speech path since this frame may be the same frame as that used for speech encoding or the frame processing may e.g. be performed on old speech samples.

The frame processor 105 is coupled to an ITD processor 107 which is arranged to determine an inter time difference between the first audio signal and the second audio signal. The inter time difference is an indication of the delay of the signal in one channel relative to the signal in the other. In the example, the inter time difference may be positive or negative depending on which of the channels is delayed relative to the other. The delay will typically occur due to the difference in the delays between the dominant speech source (i.e. the speaker currently speaking) and the microphones 101, 103.

The ITD processor 107 is furthermore coupled to two delays 109, 111. The first delay 109 is arranged to introduce a delay to the first audio channel and the second delay 109 is arranged to introduce a delay to the second audio channel. The amount of the delay which is introduced depends on the estimated inter time difference. Furthermore, in the specific example only one of the delays is used at any given time. Thus, depending on the sign of the estimated inter time difference, the delay is either introduced to the first or the second audio signal. The amount of delay is specifically set to be as close to the estimated inter time difference as possible. As a consequence, the audio signals at the output of the delays 109,111 are closely time aligned and will specifically have an inter time difference which typically will be close to zero.

The delays 109, 111 are coupled to a combiner 113 which generates a mono signal by combining the channels of the compensated multi channel audio signal and specifically by combining the two output signals from the delays 109, 111. In the example, the combiner 113 is a simple summation unit which adds the two signals together. Furthermore, the signals are scaled by a factor of 0.5 in order to maintain the amplitude of the mono signal similar to the amplitude of the individual signals prior to the combination.

Thus, the output of the combiner 113 is a mono signal which is a down-mix of the two captured signals. Furthermore, due to the delay and the reduction of the inter time difference, the generated mono signal has significantly reduced reverberation.

The combiner 113 is coupled to a mono encoder 115 which performs a mono encoding of the mono signal to generate encoded data. In the specific example, the mono encoder is a Code Excited Linear Prediction (CELP) encoder in accordance with the Embedded Variable Bit Rate Codec (EV-VBR) to be standardised by the International Telecommunication Union (ITU).

CELP coders are known to provide extremely efficient encoding and specifically to provide good speech quality even for low data rates. However, CELP coders tend not to perform as well for signals with high reverberation times and have therefore not been suitable for encoding of conventionally generated mono down mixes. However, due to the delay compensation and resulting reduced reverberation, CELP mono encoders may be used in the apparatus of FIG. 1 to provide a very efficient encoding of a speech down mix mono signal. It will be appreciated that these advantages are particularly appropriate for CELP mono encoders but are not limited thereto and may apply to many other encoders.

The mono encoder 115 is coupled to an output multiplexer 117 which is furthermore coupled to the ITD processor 107. In the example, the output multiplexer 117 multiplexes the encoding data from the mono encoder 115 and data representing the inter time difference from the ITD processor 107 into a single output bitstream. The inclusion of the inter time difference in the bitstream may assist the decoder in recreating a stereo signal from a mono signal decoded from the encoding data.

Thus, the described system provides improved performance and may in particular provide an improved audio quality for a given data rate. In particular, the improved use of a mono encoder such as a CELP encoder may result in significantly improved quality. Furthermore, the described functionality is simple to implement and has relatively low resource requirements.

Figure 2:
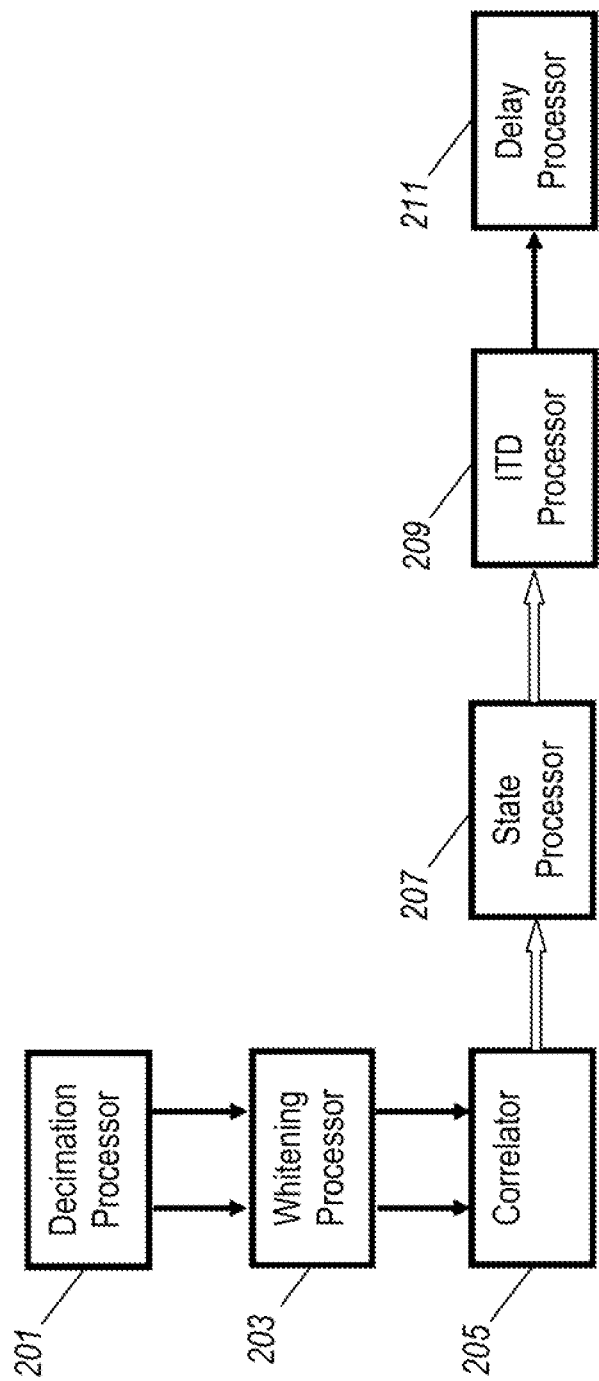
FIG. 2 illustrates an example of a processing unit for estimating an inter time difference in accordance with some embodiments of the invention.

In the following, the inter time difference estimation performed by the ITD processor 107 will be described with reference to FIG. 2.

The algorithm used by the ITD processor 107 determines an estimate of the inter time difference by combining successive observations of cross-correlations between the first and second audio signals for different possible time offsets between the channels. The correlations are performed in a decimated LPC residual domain in order to provide more well defined correlations, facilitate implementation and reduce the computational demands. In the example, the cross-correlations are processed to derive a probability associated with each potential delay between −12 ms and +12 ms (±−4 meters) and the probabilities are then accumulated using a modified Viterbi-like algorithm. The result is an estimate of the inter time difference with in-built hysteresis.

The ITD processor 107 comprises a decimation processor 201 which receives the frames of samples for the two channels from the frame processor 105. The decimation processor 201 first performs a low pass filtering followed by a decimation. In the specific example, the low pass filter has a bandwidth of around 2 kHz and a decimation factor of four is used for a 16 ksamples/sec signal resulting in a decimated sample frequency of 4 ksamples/sec. The effect of the filtering and decimation is partly to reduce the number of samples processed thereby reducing the computational demand. However, in addition, the approach allows the inter time difference estimation to be focussed on lower frequencies where the perceptual significance of the inter time difference is most significant. Thus, the filtering and decimation not only reduces the computational burden but also provides the synergistic effect of ensuring that the inter time difference estimate is relevant to the most sensitive frequencies.

The decimation processor 201 is coupled to a whitening processor 203 which is arranged to apply a spectral whitening algorithm to the first and second audio signals prior to the correlation. The spectral whitening leads to the time domain signals of the two signals more closely resembling a set of impulses, in the case of voiced or tonal speech, thereby allowing the subsequent correlation to result in more well defined cross correlation values and specifically to result in narrower correlation peaks (the frequency response of an impulse corresponds to a flat or white spectrum and conversely the time domain representation of a white spectrum is an impulse).

In the specific example, the spectral whitening comprises computing linear predictive coefficients for the first and second audio signals and to filter the first and second audio signals in response to the linear predictive coefficients.

Figure 3:
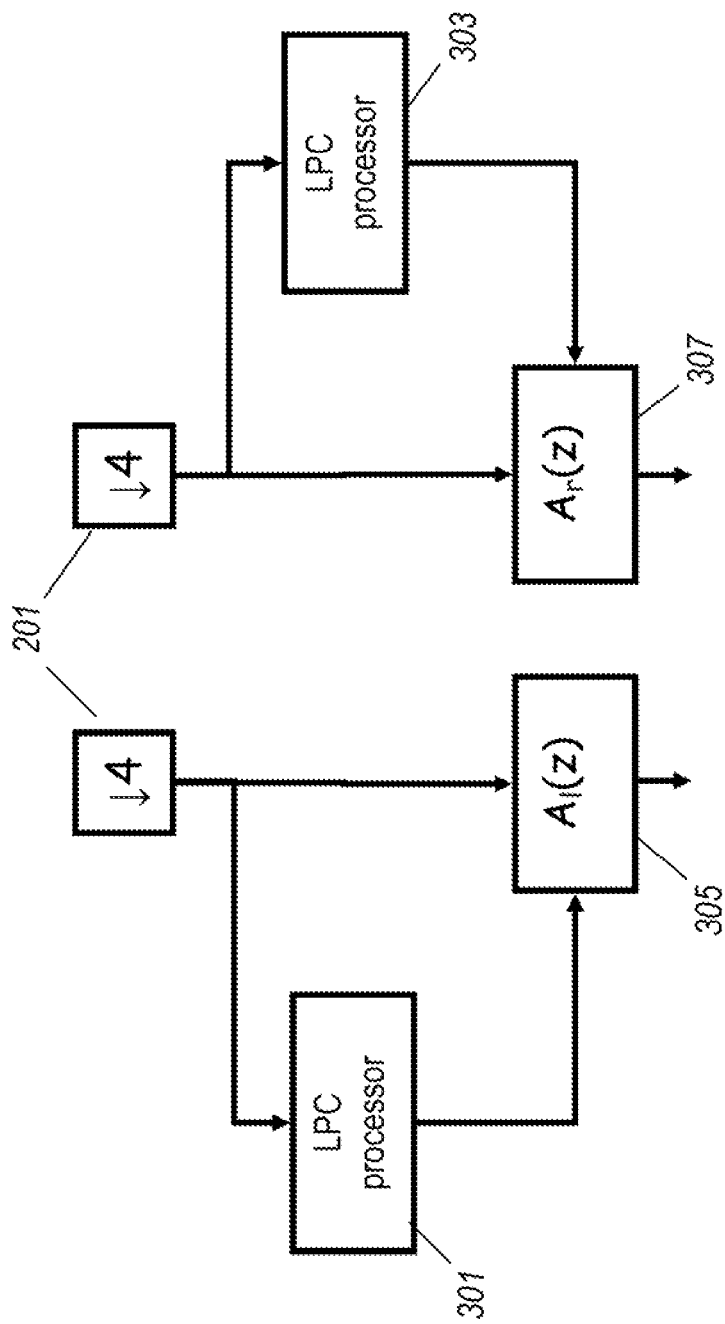
FIG. 3 illustrates an example of a whitening processor in accordance with some embodiments of the invention.

Elements of the whitening processor 203 are shown in FIG. 3. Specifically, the signals from the decimation processor 201 are fed to LPC processors 301, 303 which determine Linear Predictive Coefficients (LPCs) for linear predictive filters for the two signals. It will be appreciated that different algorithms for determining LPCs will be known to the skilled person and that any suitable algorithm may be used without detracting from the invention.

In the example, the two audio signals are fed to two filters 305, 307 which are coupled to the LPC processors 301, 303. The two filters are determined such that they are the inverse filters of the linear predictive filters determined by the LPC processors 301, 303. Specifically, the LPC processors 301, 303 determine the coefficients for the inverse filters of the linear predictive filters and the coefficients of the two filters are set to these values.

The output of the two inverse filters 305, 307 resemble sets of impulse trains in the case of voiced speech and thereby allow a significantly more accurate cross-correlation to be performed than would be possible in the speech domain.

The whitening processor 203 is coupled to a correlator 205 which is arranged to determine cross correlations between the output signals of the two filters 305, 307 for a plurality of time offsets.

Specifically, the correlator can determine the values:

$$c^t = \sum_N x_n \cdot y_{n-t}$$

where t is the time offset, x and y are samples of the two signals and N represents the samples in the specific frame.

The correlation is performed for a set of possible time offsets. In the specific example, the correlation is performed for a total of 97 time offsets corresponding to a maximum time offset of ±12 msec. However, it will be appreciated that other sets of time offsets may be used in other embodiments.

Thus, the correlator generates 97 cross-correlation values with each cross-correlation corresponding to a specific time offset between the two channels and thus to a possible inter time difference. The value of the cross-correlation corresponds to an indication of how closely the two signals match for the specific time offset. Thus, for a high cross correlation value, the signals match closely and there is accordingly a high probability that the time offset is an accurate inter time difference estimate. Conversely, for a low cross correlation value, the signals do not match closely and there is accordingly a low probability that the time offset is an accurate inter time difference estimate. Thus, for each frame the correlator 205 generates 97 cross correlation values with each value being an indication of the probability that the corresponding time offset is the correct inter time difference.

In the example, the correlator 205 is arranged to perform windowing on the first and second audio signals prior to the cross correlation. Specifically, each frame sample block of the two signals is windowed with a 20 ms window comprising a rectangular central section of 14 ms and two Hann portions of 3 ms at each end. This windowing may improve accuracy and reduce the impact of border effects at the edge of the correlation window.

Also, in the example, the cross correlation is normalised. The normalisation is specifically to ensure that the maximum cross-correlation value that can be achieved (i.e. when the two signals are identical) has unity value. The normalisation provides for cross-correlation values which are relatively independent of the signal levels of the input signals and the correlation time offsets tested thereby providing a more accurate probability indication. In particular, it allows improved comparison and processing for a sequence of frames.

In a simple embodiment, the output of the correlator 205 may directly be evaluated and the inter time difference for the current frame may be set to the value which has the highest probability as indicated by the cross correlation value. However, such a method would tend to provide a less reliable output as the speech signal fluctuates from voiced to unvoiced to silence and in the described example, the correlator is fed to a state processor 207 which processes correlation values for a plurality of states to provide a more accurate inter time difference estimate.

In the example the correlation values are used as update steps to a Viterbi algorithm metric accumulator implemented in the state processor 207.

Thus, the state processor 207 specifically implements a metric accumulator which has a number of states corresponding to the time offsets. Each state thus represents a time offset and has an associated accumulated metric value.

Accordingly, a Viterbi based trellis state machine in the form of the metric accumulator stores a metric value for each of the time offsets for which a correlation value has been calculated (i.e. 97 states/time offstets in the specific example). Each state/time offset is specifically associated with a probability metric which is indicative of the probability that the inter time difference corresponds to the time offset of that state.

The probability metrics for all time offsets are recalculated in every frame to take into account the correlation values which have been determined for the current frame. Specifically, path metrics are calculated for the states/time offsets depending on the cross correlations. In the specific example, the cross correlations are converted into the logarithmic domain by applying the formula $\log(0.5+p_i)$ where $p_i$ is the i'th correlation value (which is between 0 and 1 due to the normalisation process and corresponds to a probability that the inter time difference corresponds to the associated time offset).

In the example, the contribution to a given probability metric is determined from the previous probability metric of that time offset and the correlation value for the offset calculated for the current frame. In addition, a contribution is made from the correlation values associated with the neighbouring time offsets corresponding to the situation where the inter time difference changes from one value to another (i.e. such that the most probable state changes from being that of one time offset to being that of another time offset).

The path metrics for paths from the neighbouring states corresponding to adjacent inter time difference values are weighted substantially lower than the path metric for the path from the same state. Specifically, experiments have shown that particular advantageous performance has been found for the neighbouring correlation values being weighted at least five times higher than the cross correlations for the same state. In the specific example, the adjacent state path metrics are weighted by a factor of 0.009 and the same state path metric is weighted by a factor of 0.982.

Figure 4:
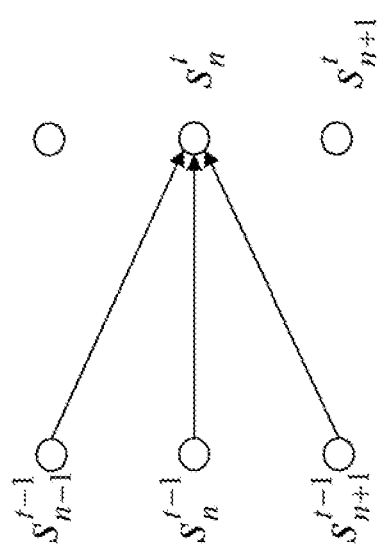
FIG. 4 illustrates an example of a state update for a trellis state machine in accordance with some embodiments of the invention.

FIG. 4 illustrates an example of a metric update for frame t for the trellis state machine. In the specific example the state probability metric for state $s_n$ at time t is calculated from the path metric of the paths from the subset of previous states comprising the state $s_n$ at time t−1 and the adjacent states $s_{n-1}$ and $s_{n+1}$ at time t−1. Specifically, the state probability metric for state $s_n$ is given by:

$$s_n^t = s_n^{t-1} + p_n^t + p_{n-1}^t + p_{n+1}^t$$

where $p_x^t$ is the calculated weighted path metric from state x to state n in frame t.

In the example, the probability metrics are modified in each frame by subtracting the lowest state probability metric from all state probability metrics. This mitigates overflow problems from continuously increasing state probability metrics.

In the example, contributions to a given time offset metric are only included for the subset of offsets comprising the offset itself and the adjacent offsets. However, it will be appreciated that in other embodiments other subsets of time offsets may be considered.

In the example, the state metrics for the trellis state machine are updated in each frame. However, in contrast to conventional Viterbi algorithms, the state processor 207 does not select a preferred path for each state but calculates the state probability metric for a given state as a combined contribution from all paths entering that state. Also, the state processor 207 does not perform a trace back through the trellis to determine surviving paths. Rather, in the example, the current inter time difference estimate can simply be selected as the time offset corresponding to the state currently having the highest state probability metric. Thus, no delay is incurred in the state machine. Furthermore, as the probability state metric depends on previous values (and other states) a hysteris is inherently achieved.

Specifically, the state processor 207 is coupled to an ITD processor 209 which determines the inter time difference from the time offset associated with a state having the highest state probability metric. Specifically, it may directly set the inter time difference to be equal to the time offset of the state having the highest state probability metric.

The ITD processor 209 is coupled to a delay processor 211 which determines the delay to be applied to the delays 109, 111. Firstly, the delay processor 211 compensates the inter time difference by the decimation factor applied in the decimation processor 201. In a simple embodiment, the estimated inter time difference may be given as a number of decimated samples (e.g. at 4 kHz corresponding to a 250 μs resolution) and this may be converted to a number of non-decimated samples by multiplying it by the decimation factor (e.g. to 16 kHz samples by multiplying it by a factor of 4).

In the example, the delay processor 211 sets the values for both delays 109, 111. Specifically, depending on the sign of the inter time difference, one of the delays is set to zero and the other delay is set to the calculated number of non-decimated samples.

The described approach for calculating the inter time difference provides improved quality of the encoded signal and in particular provides reduced reverberation of the mono signal prior to encoding, thereby improving the operation and performance of the CELP mono encoder 115.

Specific tests have been carried out where three stereo test signals were recorded in a conference room with a pair of microphones in different configurations. In the first configuration, the microphones were placed 1 m apart and two male talkers sat on-axis beyond each of the two microphones and a test conversation was recorded. In the second configuration, the two microphones were placed 3 m apart and the male talkers were again on-axis beyond each of the two microphones. In the final configuration, the microphones were 2 m apart and the two talkers were broadside to the axis of the microphones but on opposite sides of the axis facing each of the two microphones. In all of these scenarios the algorithm tracked the delays well and when the resultant mono signal was encoded with the baseline algorithm for the ITU-T EV-VBR codec, a gain of approximately 0.3 dB in SEGSNR and WSEGSNR was observed in each scenario.

In some embodiments, the transition from one delay to another is simply achieved by changing the number of samples the appropriate signal is delayed by the delays 109, 111. However, in some embodiments, functionality may be included for performing a smooth transition from one delay to another.

Specifically, the apparatus may be arranged to transition from a first delay to a second delay by generating a first signal which is delayed by the delay prior to the transition and a second signal which is delayed by the delay following the transition. The first and second signals are then combined to generate a combined signal which includes a contribution from both the signal prior to the transition and the signal following the transition. The contribution from the two signals is gradually changed such that initially the contribution is predominantly or exclusively from the first signal and at the end of the transition the contribution is predominantly or exclusively from the second signal.

Thus, the apparatus may during a delay transition synthesize two signals corresponding to the initial and the final delay. The two signals may be combined by a weighted summation such as:

$$s = a \cdot s_1 + b \cdot s_2$$

where $s_1$ and $s_2$ represent the first and second signals and a and b are weights that are modified during the transition interval (which specifically may be equal to a single frame). Specifically, initially the values may be set to a=1 and b=0 and the final values may be set to a=0 and b=1. The transition between these values may be performed in accordance with any suitable function and may specifically maintain the relationship a+b=1 during the transition.

Thus, in such embodiments a smooth transition between different delays is achieved by synthesizing signals for both delays and gradually transitioning from one to the other in the time domain.

In the specific example, a 20 ms half-Hann overlap-add window is applied to ensure that the transition from one delay to the next is as imperceptible as possible.

Figure 5:
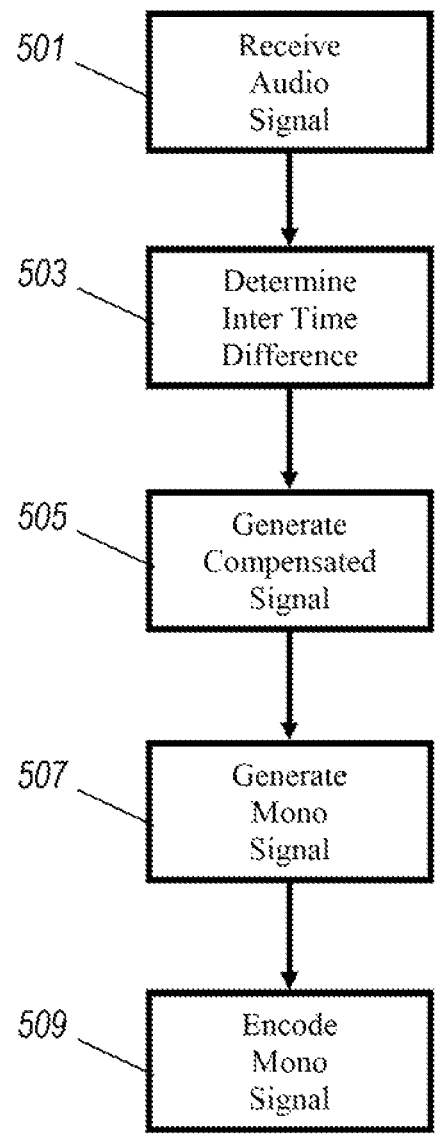
FIG. 5 illustrates an example of a method for encoding a multi channel audio signal in accordance with some embodiments of the invention.

FIG. 5 illustrates a method of encoding a multi channel audio signal in accordance with some embodiments of the invention.

The method initiates in step 501 wherein the multi channel audio signal comprising at least a first audio signal from a first microphone and a second audio signal from a second microphone is received.

Step 501 is followed by step 503 wherein an inter time difference between the first audio signal and the second audio signal is determined Step 503 is followed by step 505 wherein a compensated multi channel audio signal is generated from the multi channel audio signal by delaying at least one of the first and second stereo signals in response to the inter time difference signal.

Step 505 is followed by step 507 wherein a mono signal is generated by combining channels of the compensated multi channel audio signal.

Step 507 is followed by step 509 wherein the mono signal is encoded by a mono signal encoder.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processor or controllers. Hence, references to specific functional units are only to be seen as references to suitable means for providing the described functionality rather than indicative of a strict logical or physical structure or organization.

The invention can be implemented in any suitable form including hardware, software, firmware or any combination of these. The invention may optionally be implemented at least partly as computer software running on one or more data processors and/or digital signal processors. The elements and components of an embodiment of the invention may be physically, functionally and logically implemented in any suitable way. Indeed the functionality may be implemented in a single unit, in a plurality of units or as part of other functional units. As such, the invention may be implemented in a single unit or may be physically and functionally distributed between different units and processors.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term comprising does not exclude the presence of other elements or steps.

Furthermore, although individually listed, a plurality of units, means, elements or method steps may be implemented by e.g. a single unit or processor. Additionally, although individual features may be included in different claims, these may possibly be advantageously combined, and the inclusion in different claims does not imply that a combination of features is not feasible and/or advantageous. Also the inclusion of a feature in one category of claims does not imply a limitation to this category but rather indicates that the feature is equally applicable to other claim categories as appropriate. Furthermore, the order of features in the claims does not imply any specific order in which the features must be worked and in particular the order of individual steps in a method claim does not imply that the steps must be performed in this order. Rather, the steps may be performed in any suitable order.

The invention claimed is:

1. An apparatus for encoding a multi-channel audio signal, the apparatus comprising:
a receiver for receiving the multi-channel audio signal, the multi-channel audio signal comprising a first audio signal from a first microphone and a second audio signal from a second microphone;
a time-difference unit for determining an inter-time difference between the first audio signal and the second audio signal by combining successive observations of cross correlations between the first audio signal and the second audio signal for a plurality of time offsets for determining the inter-time difference in response to the cross correlations and where the cross-correlations are processed to derive probabilities that are accumulated using a modified Viterbi algorithm;
a delay unit for generating a compensated multi-channel audio signal from the multi-channel audio signal by delaying at least one of the first audio signal and the second audio signal in response to the inter-time difference signal;
a mono unit for generating a mono signal by combining channels of the compensated multi-channel audio signal;
a mono signal encoder for encoding the mono signal; and
an output multiplexer for multiplexing the encoded mono signal and data representing the inter-time difference, wherein the time difference unit comprises;
a trellis state machine having a plurality of states, each of the plurality of states corresponding to a time offset of the plurality of time offsets;
a path unit for determining path metrics for states of the trellis state machine in response to the cross correlations;
a probability unit for determining state probability metrics for the states in response to path metrics associated with paths from previous states to current states; and
a unit for determining the inter-time difference in response to the state probability metrics.

2. The apparatus of claim 1 wherein the time-difference unit is arranged to apply a spectral whitening to the first audio signal and to the second audio signal prior to the correlation.

3. The apparatus of claim 2 wherein the spectral whitening comprises computing linear predictive coefficients for the first audio signal and for the second audio signal and filtering the first audio signal and the second audio signal in response to the linear predictive coefficients.

4. A method for encoding a multi-channel audio signal, the method comprising:
receiving the multi-channel audio signal, the multi-channel audio signal comprising a first audio signal from a first microphone and a second audio signal from a second microphone;
determining an inter-time difference between the first audio signal and the second audio signal by combining successive observations of cross correlations between the first audio signal and the second audio signal for a plurality of time offsets for determining the inter-time difference in response to the cross correlations and where the cross-correlations are processed to derive probabilities that are accumulated using a modified Viterbi algorithm;
generating a compensated multi-channel audio signal from the multi-channel audio signal by delaying at least one of the first audio signal and the second audio signal in response to the inter-time difference signal;
generating a mono signal by combining channels of the compensated multi-channel audio signal;
encoding the mono signal; and
multiplexing the encoded mono signal and data representing the inter-time difference, wherein the time-difference step uses a trellis state machine having a plurality of states, each of the plurality of states corresponding to a time offset of the plurality of time offsets;
the time-difference step further including the steps of:
determining path metrics for states of the trellis state machine in response to the cross correlations;
determining state probability metrics for the states in response to path metrics associated with paths from previous states to current states; and
determining the inter-time difference in response to the state probability metrics.

5. The method of claim 4 wherein the time-difference unit is arranged to apply a spectral whitening to the first audio signal and to the second audio signal prior to the correlation.

6. The method of claim 5 wherein the spectral whitening comprises computing linear predictive coefficients for the first audio signal and for the second audio signal and filtering the first audio signal and the second audio signal in response to the linear predictive coefficients.

* * * * *